United States Patent [19]

Mahlkow et al.

[11] Patent Number: 4,611,554

[45] Date of Patent: Sep. 16, 1986

[54] METHOD AND DEVICE FOR THE TREATMENT OF PRINTED CIRCUIT BOARDS

[75] Inventors: Hartmut Mahlkow; Horst Bläsing, both of Berlin, Fed. Rep. of Germany

[73] Assignee: Schering Aktiengesellschaft, Berlin and Bergkamen, Fed. Rep. of Germany

[21] Appl. No.: 694,639

[22] Filed: Jan. 24, 1985

[30] Foreign Application Priority Data

Feb. 21, 1984 [DE] Fed. Rep. of Germany ....... 3406583

[51] Int. Cl.⁴ .......................... H05K 3/14; H05K 3/42
[52] U.S. Cl. ................................... 118/316; 118/324; 118/326; 427/97
[58] Field of Search ...................... 118/316, 326, 324; 427/97

[56] References Cited

U.S. PATENT DOCUMENTS

| | | | |
|---|---|---|---|
| 3,122,449 | 2/1964 | Swanson | 427/306 |
| 3,298,588 | 1/1967 | Shomphe | 118/326 |
| 3,798,050 | 3/1974 | Franz | 106/1.11 |
| 3,931,790 | 1/1976 | Franz | 118/316 |
| 4,539,069 | 9/1985 | Fishman | 118/316 |

FOREIGN PATENT DOCUMENTS 913612 3/1982 U.S.S.R. ................. 427/98

Primary Examiner—John D. Smith
Attorney, Agent, or Firm—Michael J. Striker

[57] ABSTRACT

A device and method for the treatment of printed circuit boards with process solutions, in which the boards being treated are continually vertically moved by a transporting conveyer above an accumulating reservoir and below spraying nozzles which apply a process solution to the side surfaces of each board. Two collecting receivers are arranged in mirror-inverted relationship at two sides of the boards being treated. The reservoir, into which the process solution drains from the receivers and the boards, is connected to the spraying nozzles by tubular conduits, provided with regulating valves, in a closed circuit, whereby the accumulated solution is fed back to the nozzles.

8 Claims, 4 Drawing Figures

F I G. 1
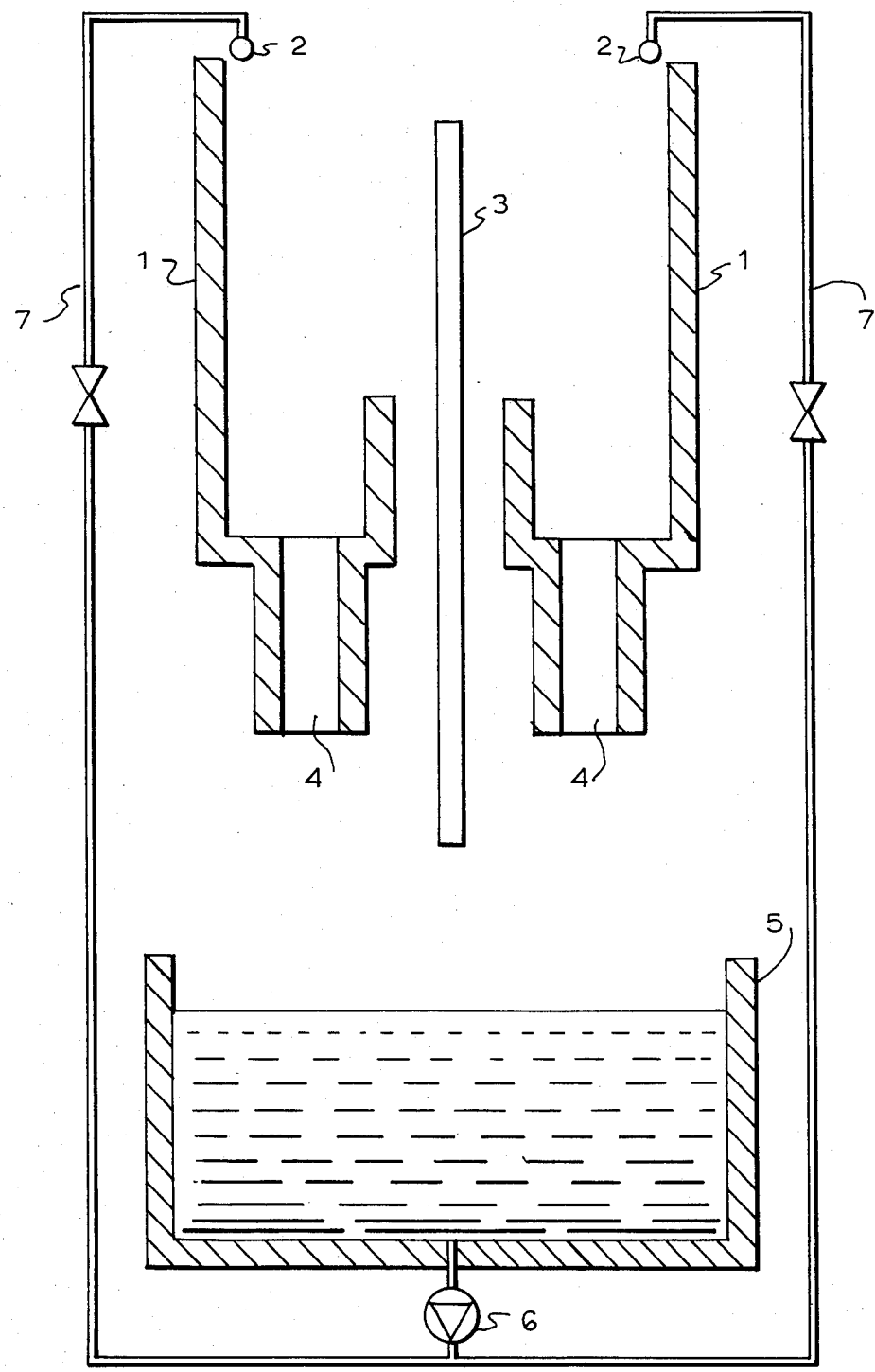

METHOD AND DEVICE FOR THE TREATMENT OF PRINTED CIRCUIT BOARDS

BACKGROUND OF THE INVENTION

The present invention relates to a method and a device for the treatment of printed circuit boards with process solutions.

Devices and methods for a continual treating of outer surfaces of printed circuit boards of the type under discussion have been known.

The treatment of the printed circuit boards with various process solutions is carried out to provide a so-called basis material, which can be then copper-coated, by applying to the boards or plates suitable process solutions, such as cleaning agents, rinsing solutions, etching solutions, neutralizing solutions in chemical baths to form electrically-conductive paths on the plates and in case of the drilled plates to make them through-contacting.

The application of the process solutions is carried out, on the one hand, by means of an immersion treatment, in which boards or plates are suspended on the frame advanced by means of any suitable transporting device and immersed into a container filled with a respective treatment solution, and then transported from one container to another. This method, however has required a great deal of space for the whole treatment device. Making the boards or plates through contacting by this conventional technique has been usually non-satisfactory and time-consuming.

On the other hand, the application of process solutions by spraying them onto the printed circuit boards has been normally utilized mainly for rinsing and was not suitable for agressive process solutions because these solutions are smoke-screened when a required spraying pressure is applied to the boards being treated and this treatment was therefore not satisfactory. Moreover, making the boards or plates through-contacting has not been possible when conventional spraying techniques were utilized.

SUMMARY OF THE INVENTION

It is an object of the present invention to provide an improved method and device which would make possible a space-and-time-saving treatment of vertically transported printed circuit boards with treatment solutions for obtaining through-contacting.

This and other objects of this invention are attained by a device for the treatment of printed circuit boards with process solutions, comprising a container for collecting a treatment solution; a continuous conveyer for continually moving the boards vertically above said container; nozzles for applying a treatment solution to the boards being treated; tubular conduits connected to said nozzles and to said container for conveying a treatment solution to the nozzles; and two similar receivers positioned above said container and below said nozzles and arranged in mirror-inverted relationship relative to each other, said receivers being positioned at two sides of the board being treated and parallel to the direction of moving the boards, each receiver having at a lower end an outlet opening, an inner side wall facing the board being treated and an outer wall facing away from the board, said inner wall being shorter than said outer wall.

The receivers may be rectangular in shape.

The nozzles may be positioned at upper ends of the outer walls of the receivers. Each nozzle may be formed as a nozzle bar or a strip.

Each of the nozzles may include a nozzle head which has a transversal bore extended normally to a plane of the board being treated.

The collecting container may be connected to said nozzles by the tubular conduits.

The device of this invention may be utilized for through-contacting of printed circuit tracks.

The device of the invention may further include separate feeding devices for various process solutions, said feeding devices being arranged one after another for applying various solutions to an outer surface of each board provided with holes to produce through-contacting on said boards.

The objects of the present invention may be further attained by a method of continually treating outer surfaces of printed circuit boards provided with holes to produce through-contacting on said boards by applying thereto of process and/or electrolyte solutions, comprising the steps of vertically moving said boards in a suspended position by a continuous conveyor; applying a treatment solution to said boards; draining said solution and collecting the latter; and feeding said solution after the draining and collecting step in a closed cycle back to said applying step.

Each process solution may be conveyed at two sides of the board being treated, by means of two receivers, into a collecting container from which the solution is fed back to said applying step.

Each process solution may be applied to each board in a separate treatment stage.

One of the process solutions may be a watery alkaline solution of a palladium complex which is adjusted to suitable pre-and-after treatment solutions. This process solution has proven to be particularly suitable for activating. Said palladium complex is palladium salt from aminopyridone.

The method may be utilized for producing contact switches.

The device according to the present invention provides the treatment of printed circuit boards with through-contacting surfaces thereon which does not require a great deal of space.

By the device according to the invention the process solutions are applied directly onto the plates or boards so that the solutions are poured on the outer surface of each board and flow downwardly under gravity, whereby strong turbulent streams are produced in the holes formed in each board. Vortexes, which result from these streams prevent the formation of air blasts and serve the purpose of providing intensive contact of the process solutions with the surfaces of the holes formed in the printed circuit boards.

A further specific advantage of the device of the present invention resides in that it is light because it does not require conventional baths and heavy transportation means.

The fact that the device requires a little space to occupy further makes it possible that the device can be covered from the environment.

Inasmuch as the process solutions utilized are processed within a closed circuit the filtration of these solutions presents no problem. Furthermore, volumes of these solutions can be substantially reduced as compared to those in conventional methods.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIG. 1 is a schematic representation of the device according to the invention;

DETAILED DESCRIPTION OF THE PREFERRED EMBODIMENT

Figure 2:
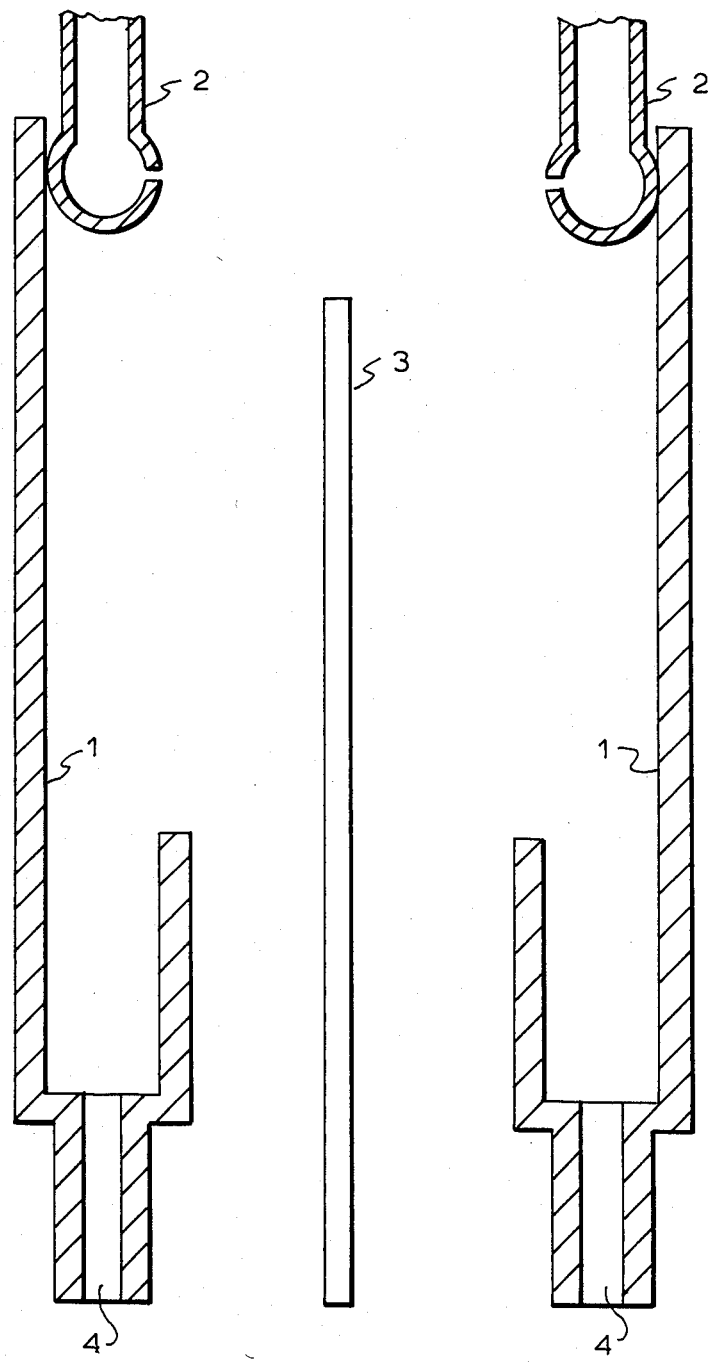
FIG. 2 is a cross-sectional view through a detail of FIG. 1.

Referring now to the drawings in detail reference numerals 1 designate two collecting tanks having outlet openings 4. A printed circuit board 3 to be treated is suspended on a continual conveyor (non-shown but of any suitable conventional type) between two collecting tanks 1. An accumulator or reservoir 5 is positioned below the board 3 to be treated. Nozzles 2 are arranged above the respective collecting tanks 1. Tubular conduits 7 with regulating valves of conventional design are connected to the nozzles 2. Tubular conduits 6, also provided with suitable valves, are interconnected between reservoir 5 and tubular conduits 7.

The structure of the nozzles 2 is more clearly shown in FIG. 2. Each nozzle has a nozzle head provided with a transverse bore directed towards the board being treated.

Figure 3:
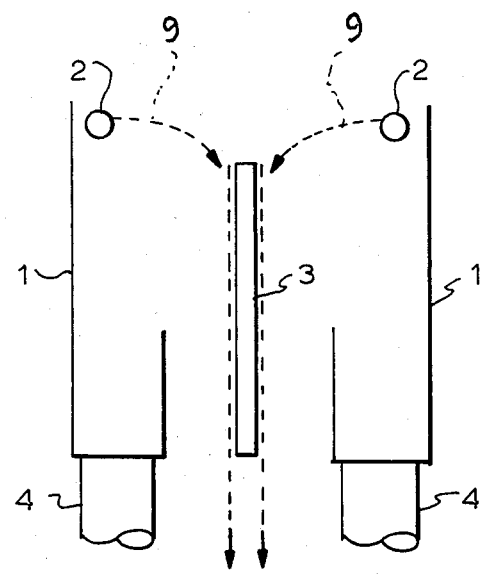
FIG. 3 is a schematic view showing the device of the invention during the treatment of the printed circuit board.
Figure 4:
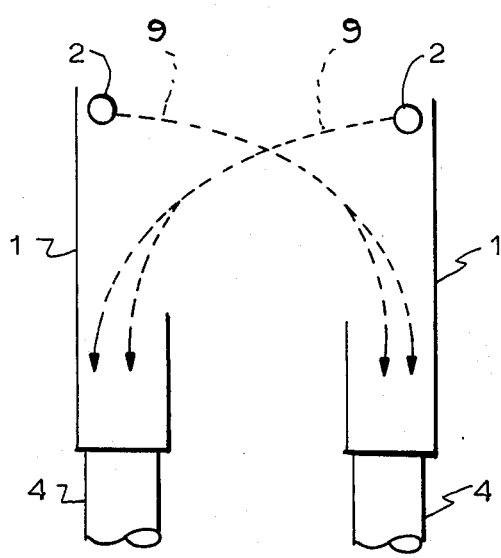
FIG. 4 is a schematic view showing the device of FIG. 3 in a non-operative position.

In FIGS. 3 and 4 reference numerals 9 designate the streams of a treating agent.

The method of this invention as well as the operation of the device for treating printed circuit boards will be explained below in reference to the following example.

Example:

Usual standard plates, made of double-side copper-coated and glass-fiber-reinforced epoxy resin, are provided with bores in the usual fashion and then suspended on a continuous conveyor which feeds the plates through a number of the devices of the invention, assembled together and provided with separate feeding arrangements for various process solutions.

Below are given the time periods for the treatment of printed circuit boards with the process solutions of conventional compositions:

1. Cleaning solution (on the basis of alkali hydroxide solution) 0.5 min
2. Rinsing s-lution (water) 0.5 min
3. Etching solution (on the basis of stabilizing sulfuric acid solution of hydrogen peroxide) 0.5 min
4. Rinsing solution (water) 0.5 min
5. Neutralizing solution (on the basis of alkaline hydroxide solution) 0.5 min
6. Rinsing solution (water) 1.0 min
7. Pre-activation solution (on the basis of the wetting-agent-containing sulfuring acid solution) 0.5 min
8. Activation solution (on the basis of alkaline solution of palladium complex) 0.5 min
9. Rinsing solution (water) 0.5 min
10. Reduction solution (on the basis of boric hydroxide-solution) 0.5 min The entire period of time of treating printed circuit boards amounts therefore to 5.5 min, and the boards or plates are then chemically metallized in the usual manner by means of conventional copper baths which contain a copper salt, ethylene-diaminetetraacetate, alkaline cyanide, alkaline hydroxide and formaldehyde.

In all cases through-contacting printed circuit boards result with characteristic data of at least $1.10^{12}\Omega$.

Respective printed circuit boards are treated by a conventional immersion method in an analogous manner.

The periods of time of the treatment during the immersion method are as follows:

Treatment No. 1. 5 min
Treatment No. 2. 1 min
Treatment No. 3. 2 min
Treatment No. 4. 1 min
Treatment No. 5. 2 min
Treatment No. 6. 3 min
Treatment No. 7. 0.5 min
Treatment No. 8. 5 min
Treatment No. 9. 1 min
Treatment No. 10. 5 min It is of course understood that the solutions utilized in the treatments Nos. 1–10, respectively, correspond to the solutions used in the treatments 1–10 of the previous table.

The entire period of time of the conventional immersion-type treatment technique amounts to 25.5 min and is about 5 times longer than the entire time period of the treatment by the method according to this invention.

During the final chemical copper-coating after the treatment by the conventional process however partially non-satisfactory through-contacting plates or boards will result.

It will be understood that each of the elements described above, or two or more together, may also find a useful application in other types of methods and devices for the treatment of printed circuit boards with processing solutions difering from the types described above.

While the invention has been illustrated and described as embodied in a method and a device for the treatment of printed circuit boards with processing solutions, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A device for the treatment of printed circuit boards with process solutions, comprising a container for collecting a treatment solution, a continuous conveyor for continually moving the boards vertically above said container; nozzles for applying a treatment solution to the boards being treated; tubular conduits connected to said nozzles and to said container for conveying a treatment solution to the nozzles; and two similar receivers positioned above said container and below said nozzles and arranged in mirror-inverted relationship relative to each other, said receivers being positioned at two sides of the board being treated and parallel to the direction of moving the boards, each receiver having at a lower end an outlet opening, an inner side wall facing the board being treated and an outer wall facing away from the board, said inner wall being shorter than said outer wall.

2. The device as defined in claim 1, wherein said receivers are rectangular.

3. The device as defined in claim 1, wherein said nozzles are positioned at upper ends of said outer walls of the receivers.

4. The device as defined in claim 1, wherein said nozzles are each formed as a nozzle bar.

5. The device as defined in claim 1, wherein each of said nozzles includes a nozzle head which has a transversal bore directed normally to a plane of the board being treated.

6. The device as defined in claim 1, wherein said collecting container is connected to said nozzles by the tubular conduits.

7. The device as defined in claim 1, which is utilized for through-contacting of printed circuit tracks.

8. The device as defined in claim 7, further including separate feeding devices for various process solutions; said feeding devices being arranged one after another for applying various solutions to an outer surface of each board provided with holes to produce through-contacting on said boards.

* * * * *